United States Patent
Farrar

(10) Patent No.: US 6,890,847 B1
(45) Date of Patent: May 10, 2005

(54) POLYNORBORNENE FOAM INSULATION FOR INTEGRATED CIRCUITS

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/507,964

(22) Filed: Feb. 22, 2000

(51) Int. Cl.⁷ .......................................... H01L 21/4763
(52) U.S. Cl. ........................ 438/623; 438/780; 438/781
(58) Field of Search ................................. 438/780, 781, 438/623, FOR 395; 427/96, 244

(56) References Cited

U.S. PATENT DOCUMENTS

| | | | |
|---|---|---|---|
| 3,506,438 A | 4/1970 | Krock et al. ................... 75/208 |
| 3,953,566 A | 4/1976 | Gore ........................... 264/288 |
| 3,956,195 A | * 5/1976 | Topchiashvili et al. ..... 252/511 |
| 3,962,153 A | 6/1976 | Gore ........................ 260/2.5 R |
| 4,096,227 A | 6/1978 | Gore ........................ 264/210 R |
| 4,368,350 A | 1/1983 | Perelman ..................... 174/102 |
| 4,482,516 A | 11/1984 | Bowman et al. ............ 264/127 |
| 4,561,173 A | 12/1985 | Te Velde .................... 438/619 |
| 4,599,136 A | 7/1986 | Araps et al. ................. 156/643 |
| 4,725,562 A | 2/1988 | El-Kareh et al. ........... 437/677 |
| 4,749,621 A | 6/1988 | Araps et al. ............. 428/473.5 |
| 4,962,058 A | 10/1990 | Cronin et al. ............... 437/187 |

(Continued)

FOREIGN PATENT DOCUMENTS

| EP | 578856 A1 | 7/1992 | ......... H01L/21/334 |
|---|---|---|---|
| GB | 2158995 A | 11/1985 | .......... H01Q/17/00 |
| JP | 230505 A | * 8/2001 | |

OTHER PUBLICATIONS

Bai, Yiqun et al., "Photosensitive Polynorbomene as a Dielectric Material for Packaging Applications", 2001 International Symposium on Advanced Packaging Materials, pp. 322–326.*

Grove, Nicole R. et al., "Functionalized Polynorbornene Dielectric Polymers: Adhesion and Mechanical Properties", Journal of Polymer Science: Part B: Polymer Physics, vol. 37, p. 3003–3010 (1999).*

In: Metals Handbook Ninth Edition, vol. 2 Properties and Selection; Nonferrous Alloys and Pure Metals, ASM International, pp. 796–797, (1979).

"ACCUSPIN T–18 Flowable spin–On Polymer (SOP)", AlliedSignal—Advanced Microelectronic Materials, Sunnyvale, CA, pp. 1–2, (Jul. 1998).

"Packaging", Electronic Materials Handbook, vol. 1, ASM International, pp. 105, 768–769, (1989).

"Properties and Selection: Nonferrous Alloys and Pure Metals", Metals Handbook Ninth Edition, vol. 2, ASM International, pp. 157, 395, (1979).

(Continued)

Primary Examiner—George Fourson
Assistant Examiner—Michelle Estrada
(74) Attorney, Agent, or Firm—Schwegman, Lundberg, Woessner & Kluth, P.A.

(57) ABSTRACT

Methods of providing foamed polynorbornene insulating material for use with an integrated circuit device, as well as apparatus and systems making use of such foamed polynorbornene insulating materials. The methods include forming a layer of polynorbornene material and converting at least a portion of the layer of polynorbornene material to a foamed polynorbornene material, such as by exposing the layer of polynorbornene material to a supercritical fluid. The foamed polynorbornene material can provide electrical insulation between conductive layers of the integrated circuit device.

41 Claims, 9 Drawing Sheets

U.S. PATENT DOCUMENTS

| | | | |
|---|---|---|---|
| 5,103,288 A | 4/1992 | Sakamoto et al. | 357/71 |
| 5,128,382 A | 7/1992 | Elliott, Jr. et al. | 521/178 |
| 5,137,780 A | 8/1992 | Nichols et al. | 428/336 |
| 5,158,986 A | 10/1992 | Cha et al. | 521/82 |
| 5,158,989 A | 10/1992 | Ogitani et al. | 522/77 |
| 5,171,713 A | 12/1992 | Matthews | 437/189 |
| 5,173,442 A | 12/1992 | Carey | 437/173 |
| 5,227,103 A | 7/1993 | Muschiatti | 264/45.9 |
| 5,324,683 A | 6/1994 | Fitch et al. | 437/65 |
| 5,334,356 A | 8/1994 | Baldwin et al. | 422/133 |
| 5,340,843 A | 8/1994 | Tsuruta et al. | 521/79 |
| 5,408,742 A | 4/1995 | Zaidel et al. | 29/846 |
| 5,449,427 A | 9/1995 | Wojnarowski et al. | 156/155 |
| 5,470,693 A | 11/1995 | Sachdev et al. | 430/315 |
| 5,470,802 A | 11/1995 | Gnade et al. | 437/238 |
| 5,473,814 A | 12/1995 | White | 29/840 |
| 5,480,048 A | 1/1996 | Kitamura et al. | 216/13 |
| 5,486,493 A | 1/1996 | Jeng | 437/195 |
| 5,510,645 A | 4/1996 | Fitch et al. | 257/522 |
| 5,548,159 A | 8/1996 | Jeng | 257/634 |
| 5,552,638 A | 9/1996 | O'Connor et al. | 257/759 |
| 5,554,305 A | 9/1996 | Wojnarowski et al. | 216/62 |
| 5,554,554,870 A | 9/1996 | Fitch et al. | 257/334 |
| 5,591,676 A | 1/1997 | Hughes et al. | 437/195 |
| 5,593,926 A | 1/1997 | Fujihira | 437/209 |
| 5,747,880 A | 5/1998 | Havemann et al. | 257/759 |
| 5,780,121 A | 7/1998 | Endo | 427/569 |
| 5,785,787 A | 7/1998 | Wojnarowski et al. | 156/155 |
| 5,786,630 A | 7/1998 | Bhansali et al. | 257/697 |
| 5,798,200 A | 8/1998 | Matsuura et al. | 430/126 |
| 5,804,607 A * | 9/1998 | Hedrick et al. | 521/64 |
| 5,821,621 A | 10/1998 | Jeng | 257/759 |
| 5,830,923 A | 11/1998 | Venkataramm | 521/64 |
| 5,841,075 A | 11/1998 | Hanson | 174/250 |
| 5,844,317 A | 12/1998 | Bertolet et al. | 257/773 |
| 5,864,923 A | 2/1999 | Rouanet et al. | 23/295 R |
| 5,878,314 A * | 3/1999 | Takaya et al. | 264/45.4 |
| 5,879,787 A | 3/1999 | Petefish | 428/209 |
| 5,879,794 A | 3/1999 | Korleski, Jr. | 428/317.1 |
| 5,891,797 A | 4/1999 | Farrar | 438/619 |
| 5,912,313 A | 6/1999 | McIntosh et al. | 526/279 |
| 5,923,074 A | 7/1999 | Jeng | 257/522 |
| 5,926,732 A | 7/1999 | Matsuura | 438/622 |
| 5,953,626 A | 9/1999 | Hause et al. | 438/622 |
| 5,994,777 A | 11/1999 | Farrar | 257/758 |
| 6,037,245 A | 3/2000 | Matsuda | 438/586 |
| 6,037,249 A | 3/2000 | Chiang et al. | 438/619 |
| 6,040,628 A | 3/2000 | Chiang et al. | 257/760 |
| 6,043,146 A * | 3/2000 | Watanabe et al. | 438/239 |
| 6,071,600 A | 6/2000 | Rosenmeayer | 428/213 |
| 6,077,792 A | 6/2000 | Farrar | 438/780 |
| 6,165,890 A | 12/2000 | Kohl et al. | 438/619 |
| 6,172,305 B1 * | 1/2001 | Tanahashi | 174/255 |
| 6,195,156 B1 | 2/2001 | Miyammoto et al. | 355/85 |
| 6,218,449 B1 * | 4/2001 | Planche et al. | 524/68 |
| 6,245,658 B1 | 6/2001 | Buynoski | 438/619 |
| 6,255,712 B1 | 7/2001 | Clevenger et al. | 257/522 |
| 6,265,303 B1 | 7/2001 | Lu et al. | 438/623 |
| 6,268,637 B1 | 7/2001 | Gardner et al. | 257/522 |
| 6,287,979 B1 | 9/2001 | Zhou et al. | 438/723 |
| 6,313,046 B1 | 11/2001 | Juengling et al. | 438/781 |
| 6,313,518 B1 | 11/2001 | Ahn et al. | 257/632 |
| 6,323,125 B1 | 11/2001 | Soo et al. | 438/645 |
| 6,331,480 B1 | 12/2001 | Tsai et al. | 438/624 |
| 6,333,556 B1 | 12/2001 | Juengling et al. | 257/758 |
| 6,342,454 B1 * | 1/2002 | Hawker et al. | 438/780 |
| 6,350,672 B1 | 2/2002 | Sun | 438/619 |
| 6,352,818 B1 * | 3/2002 | Hsieh | 134/1.3 |
| 6,380,294 B1 * | 4/2002 | Babinec et al. | 524/440 |
| 6,413,827 B2 | 7/2002 | Farrar | 438/296 |
| 6,420,261 B2 * | 7/2002 | Kudo | 438/633 |
| 6,420,262 B1 * | 7/2002 | Farrar | 438/652 |
| 6,420,441 B1 | 7/2002 | Allen et al. | 521/77 |
| 6,433,413 B1 | 8/2002 | Farrar | 257/678 |
| 6,503,818 B1 * | 1/2003 | Jang | 438/584 |
| 2001/0005625 A1 | 6/2001 | Sun | 438/634 |
| 2001/0014512 A1 | 8/2001 | Lyons et al. | 438/424 |
| 2001/0014526 A1 | 8/2001 | Clevenger et al. | 438/619 |
| 2001/0019876 A1 | 9/2001 | Juengling et al. | 438/456 |
| 2001/0034117 A1 | 10/2001 | Eldriege et al. | 438/619 |
| 2002/0019125 A1 | 2/2002 | Juengling et al. | 438/631 |
| 2002/0037603 A1 | 3/2002 | Eldridge et al. | 438/112 |
| 2002/0094651 A1 | 7/2002 | Farrar | 438/296 |

OTHER PUBLICATIONS

Chiniwalla, N., et al., "Structure–Property Relations for Polynorbornenes", *Proceedings from the Eighth Meeting of the Dupont Symposium on Polymides In Microelectronics*, pp. 615–642, (1998).

Conti, R., et al., "Processing Methods to Fill High Aspect Ratio Gaps Without Premature Constriction", *1999 Proceedings of Dielectrics for Multilevel Interconnection Conference*, pp. 201–209, (1999).

Craig, J.D., "Polymide Coating", In: *Packaging, Electronic Materials Handbook, vol. 1*, ASM International Handbook Committee (eds.), ASM International, Materials Park, OH, 767–772, (1989).

Jayaraj, K., et al., "Low Dielectric Constant Microcellular Foams", *Proceedings from the Seventh Meeting of the DuPont Symposium on Polymides in Microelectrics*, pp. 474–501, (Sep. 1996).

Jin, C., et al., "Porous Xerogel Films as Ultra–low Permittivity Dielectrics for ULSI Interconnect Applications", *Conference Proceedings ULSI XII—1997 Materials Research Society*, pp. 463–469, (1997).

Miller, R.D., et al., "Low Dielectric Constant Polyimides and Polyimide Nanofoams", *Seventh Meeting of the DuPont Symposium on Polymides in Microelectronics*, pp. 443–473, (Sep. 1996).

Ramos, T., et al., "Nanoporous Silica for Dielectric Constant Less Than 2", *Conference Proceedings ULSI XII—1997 Materials Research Society*, 455–461, (1997).

Shibasaki, T., et al., "Process and Application of Fumed Silica AEROSIL", *3rd Annual Workshop on Mechanical Polishing*, Lake Placid, New York, pp. 1–27, (1998).

Singer, P., "The new low–k candidate: It's a gas", *Semiconductor International, 22 (3)*, p. 38, (1999).

Ting, C.H., "Low K Material/Process Development", *1996 VLSI Multilevel Interconnection State–of–the–Art Seminar*, pp. 171–212, (Jun. 1996).

Van Vlack, L.H., *Elements of Materials Science*, Addison–Wesley Publishing Co., Inc. Reading, MA, p. 468, (1959).

Vardaman, E.J., "Future Packaging Trends: CSP vs. Flip Chip", *11th European Microelectrics Conference*, pp. 295–299, (1997).

Volksen, W., et al., "Characterization and Processing Considerations for Methylsilsesquioxane Based Dialectricts", *Proceedings of the Fifth Dialectric for ULSI Multilevel Interconnections*, Santa Clara, CA, pp. 83–90, (1999).

Labadie, J.W., et al.,"Nanopore Foams of High Temperature Polymers", *IEEE Transactions on Components, Hybrids, and Manufacturing Technology, 15*, (Dec., 1992),925–930.

* cited by examiner

POLYNORBORNENE FOAM INSULATION FOR INTEGRATED CIRCUITS

TECHNICAL FIELD

The present invention relates generally to development and fabrication of integrated circuits, and in particular to insulation techniques using polynorbornene foam as an insulating material in the development and fabrication of integrated circuits, as well as apparatus making use of such integrated circuits.

BACKGROUND

To meet demands for faster processors and higher capacity memories, integrated circuit (IC) designers are focusing on decreasing the minimum feature size within integrated circuits. By minimizing the feature size within an integrated circuit, device density on an individual chip increases exponentially, as desired, enabling designers to meet the demands imposed on them. As the minimum feature size in semiconductor integrated circuits decreases, however, capacitive coupling between adjacent conductive layers is becoming problematic. In particular, for example, capacitive coupling between metal lines in the metallization level of integrated circuits limits the minimum feature size that is operatively achievable.

One attempt to minimize the problem of capacitive coupling between metal lines involves utilizing a relatively low dielectric constant material to insulate the metal lines. Conventionally, silicon dioxide ($SiO_2$), having a dielectric constant of about $4.0\in_o$ (wherein $\in_o$ is the permittivity of free space), is used as the insulating material in integrated circuits. To date, the minimum dielectric constant possible, however, is generally that of air, the dielectric constant being approximately $1.0\in_o$. Nevertheless, the use of air as an insulating material, such as provided using an air bridge, has drawbacks. For example, integrated circuit structures utilizing air insulation lack mechanical strength and protection from their environment. $SiO_2$ and air have been utilized together in an inorganic, porous silica xerogel film in order to incorporate both the mechanical strength of $SiO_2$ and the low dielectric constant of air. In this manner, $SiO_2$ behaves as a matrix for porous structures containing air. However, porous silica xerogel film has a tendency to absorb water during processing. The water absorbed during processing is released during aging, resulting in cracking and a pulling away of the porous silica xerogel film from the substrate on which it is applied.

Even when nonporous $SiO_2$ is utilized, as the minimum feature size within an integrated circuit decreases, significant stress develops at the interface between the $SiO_2$ and metal on which $SiO_2$ is commonly formed, causing potentially detrimental disruptions in the electrical performance of the integrated circuit. For example, the stress may be great enough to rupture a metal line adjacent to the $SiO_2$ insulating layer. Such stress develops from the large difference in the coefficient of thermal expansion between that of $SiO_2$ and that of the metal. The coefficient of thermal expansion of $SiO_2$ is about 0.5 $\mu m/m°$ C. to about 3.0 $\mu m/m°$ C. The coefficient of thermal expansion of Type 295.0 aluminum, an alloy similar in composition to the aluminum alloys commonly used in the metallization level of an integrated circuit, is about 23 $\mu m/m°$ C. The coefficient of thermal expansion for aluminum is significantly higher than that of $SiO_2$. Likewise, the coefficient of thermal expansion of Type C81100 copper, an alloy similar in composition to a copper alloy which may also be used in integrated circuit metallization layers, is about 16.9 $\mu m/m°$ C., also significantly higher than that of $SiO_2$. The metallization layer's larger coefficient of thermal expansion results in its absorption of all of the strain caused by the large difference in the coefficients of thermal expansion upon heating and cooling. The result of such strain absorption is that the metallization layer is placed in tension and the $SiO_2$ layer is placed under slight compression. The high compressive yield strength of $SiO_2$ prevents its rupture. In contrast, the relatively low tensile yield strength of the metallization layer promotes its rupture, leading to integrated circuit failure.

It has also been reported that certain polymeric materials have dielectric constants less than that of $SiO_2$. For example, polyimides are known to have a dielectric constant of about $2.8\in_o$ to about $3.5\in_o$. The use of polyimides in the metallization level of integrated circuits is also known.

Others have reported that foaming (i.e., introducing air into) polymeric material results in a material having a dielectric constant of about $1.2\in_o$ to about $1.8\in_o$. The exact dielectric constant of such foamed polymers depends on the percentage of voids (e.g., air) present and the dielectric constant of the polymeric material that was foamed. The use of such foamed polymers, however, has been limited to electronic packaging applications and multichip module applications for microwave substrates. Multichip module processing is not suitable for use in semiconductor fabrication because in multichip module processing, a metal insulator "sandwich" is formed as a unit and is then applied to a surface. Due to the oftentimes uneven topographies at the metallization level of an integrated circuit, each of the metal layer and the insulation layer need to be formed separately, allowing them to conform to the underlying topography.

For the reasons stated above, and for other reasons stated below which will become apparent to those skilled in the art upon reading and understanding the present specification, there is a need in the art for alternative insulating materials and methods of their use in an integrated circuit.

SUMMARY OF THE INVENTION

The invention includes methods of providing foamed polynorbornene insulating material for use with an integrated circuit device, as well as apparatus and systems making use of such foamed polynorbornene insulating materials. The methods include forming a layer of polynorbornene material and converting at least a portion of the layer of polynorbornene material to a foamed polynorbornene material, such as by exposing the layer of polynorbornene material to a supercritical fluid. The foamed polynorbornene material can provide electrical insulation between conductive layers of the integrated circuit device.

For one embodiment, the invention includes a method of forming an insulating material for use in an integrated circuit. The method includes forming a layer of polynorbornene material on a substrate and converting at least a portion of the layer of polynorbornene material to a foamed polynorbornene material.

For another embodiment, the invention includes a method of forming an insulating material for use in an integrated circuit. The method includes forming a layer of polynorbornene material on a substrate, saturating the layer of polynorbornene material with a fluid at or above the critical point of the fluid in a process chamber, and depressurizing the process chamber, thereby converting at least a portion of the layer of polynorbornene material to a foamed polynorbornene material.

For a further embodiment, the invention includes a method of forming a portion of an integrated circuit device. The method includes forming an active area in a substrate, forming a layer of polynorbornene material overlying the active area, saturating the layer of polynorbornene material with a fluid at or above the critical point of the fluid in a process chamber, and depressurizing the process chamber, thereby converting at least a portion of the layer of polynorbornene material to a foamed polynorbornene material. The method further includes patterning the foamed polynorbornene material to expose portions of the foamed polynorbornene material, etching the exposed portions of the foamed polynorbornene material to form a contact hole to the active area, and forming a conductive layer in the contact hole.

For a still further embodiment, the invention includes a method of forming a portion of an integrated circuit device. The method includes forming a first conductive layer, forming a layer of polynorbornene material on the first conductive layer, saturating the layer of polynorbornene material with a fluid at or above the critical point of the fluid in a process chamber, and depressurizing the process chamber, thereby converting at least a portion of the layer of polynorborene material to a foamed polynorbornene material. The method further includes removing a portion of the foamed polynorbornene material to form at least one via to the first conductive layer and forming a second conductive layer in the at least one via to couple to the first conductive layer.

For yet another embodiment, the invention includes a semiconductor die. The semiconductor die includes an integrated circuit supported by a substrate and having a plurality of integrated circuit devices, and two or more conductive layers coupled to the plurality of integrated circuit devices. A first conductive layer of the two or more conductive layers is electrically insulated from a second conductive layer of the two or more conductive layers by a foamed polynorbornene material.

For one embodiment, the invention includes a memory device. The memory device includes an array of memory cells, a row access circuit coupled to the array of memory cells, a column access circuit coupled to the array of memory cells, an address decoder circuit coupled to the row access circuit and the column access circuit, and two or more conductive layers coupled to one or more of the array of memory cells, the address decoder circuit, the row access circuit and the column access circuit. A first conductive layer of the two or more conductive layers is electrically insulated from a second conductive layer of the two or more conductive layers by a foamed polynorbornene material.

For another embodiment, the invention includes a memory module. The memory module includes a support, a plurality of leads extending from the support, a command link coupled to at least one of the plurality of leads, a plurality of data links, wherein each data link is coupled to at least one of the plurality of leads, and at least one memory device contained on the support and coupled to the command link. The memory device includes an array of memory cells, a row access circuit coupled to the array of memory cells, a column access circuit coupled to the array of memory cells, an address decoder circuit coupled to the row access circuit and the column access circuit, and two or more conductive layers coupled to one or more of the array of memory cells, the address decoder circuit, the row access circuit and the column access circuit. A first conductive layer of the two or more conductive layers is electrically insulated from a second conductive layer of the two or more conductive layers by a foamed polynorbornene material.

For yet another embodiment, the invention includes a memory system. The memory system includes a controller, a command link coupled to the controller, a data link coupled to the controller, and a memory device coupled to the command link and the data link. The memory device includes an array of memory cells, a row access circuit coupled to the array of memory cells, a column access circuit coupled to the array of memory cells, an address decoder circuit coupled to the row access circuit and the column access circuit, and two or more conductive layers coupled to one or more of the array of memory cells, the address decoder circuit, the row access circuit and the column access circuit. A first conductive layer of the two or more conductive layers is electrically insulated from a second conductive layer of the two or more conductive layers by a foamed polynorbornene material.

For a still further embodiment, the invention includes an electronic system. The electronic system includes a processor and a circuit module having a plurality of leads coupled to the processor. The circuit module includes a semiconductor die coupled to the plurality of leads. The semiconductor die includes an integrated circuit supported by a substrate and having a plurality of integrated circuit devices, and two or more conductive layers coupled to the plurality of integrated circuit devices. A first conductive layer of the two or more conductive layers is electrically insulated from a second conductive layer of the two or more conductive layers by a foamed polynorbornene material.

Further embodiments of the invention include semiconductor structures and methods of varying scope, as well as apparatus, devices, modules and systems making use of such semiconductor structures and methods.

DETAILED DESCRIPTION OF THE EMBODIMENTS

Figure 1A:
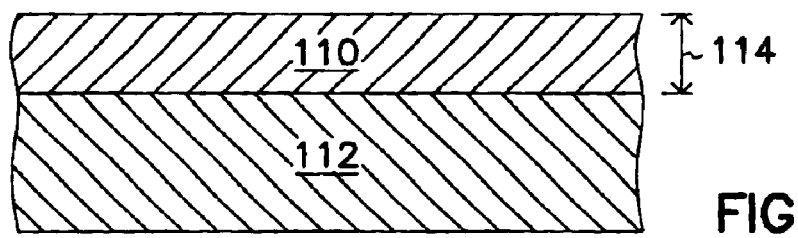
FIGS. 1A–1F are cross-sectional views of a portion of a semiconductor structure at various processing stages in accordance with an embodiment of the invention.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

In accordance with the present invention, foamed polynorbornene material is utilized as an insulating material within an integrated circuit (IC). Polynorbornene materials as disclosed herein exhibit a tendency to flow more readily than non-polymeric materials, making their application much easier than, for example, ceramic materials.

The use of foamed polynorbornene material advantageously provides a lower dielectric constant insulating material within an integrated circuit relative to conventional silicon dioxide ($SiO_2$). Foamed polynorbornene material combines the minimal dielectric constant of air, $1.0\in_o$, with the mechanical strength of the polynorbornene material. The polynorbornene material behaves as a matrix for porous structures containing air or other ambient gases. The lower dielectric constant of such foamed polynorbornene material allows its advantageous use in integrated circuits where capacitive coupling has typically been problematic. Foamed polynorbornene material provides relief for capacitive coupling problems.

Foamed polynorbornene material has many advantages. For example, unlike conventional $SiO_2$, which has a dielectric constant of about $4.0\in_o$, and is used as the matrix in porous silica xerogel films, the polynorbornene matrix materials utilized in the porous insulating material of the various embodiments of the invention can have lower dielectric constants relative to that of $SiO_2$. Thus, the resulting foamed polynorbornene material can have a potentially lower dielectric constant than that of a porous silica xerogel film, depending on the percentage of voids within the material.

Furthermore, for example, foamed polynorbornene materials are advantageously more ductile than many other materials, such as porous silica xerogel films. Ceramic matrix materials such as $SiO_2$ used in porous silica xerogel film, are characterized by their lack of ductility. Foamed polynorbornene materials have a lesser tendency to crack and pull away from the substrate on which they are applied than do the counterpart porous silica xerogel films.

Foamed polynorbornene material of the various embodiments of the invention is advantageously utilized to insulate conductive layers, such as metal lines or other conductive runs, within an integrated circuit. Use of foamed polynorbornene materials as a metallization level insulating material generally assures that the material will not be subjected to high processing temperatures. Typically, at the metallization stage in the fabrication process, most of the high temperature steps have already occurred.

For the Avatrel™ polynorbornene material (available from BFGoodrich, Cleveland, Ohio, USA), processing temperatures preferably do not exceed approximately 460° C. This polynorbornene material exhibits reasonable stability at approximately 300° C., having approximately 0.1–0.2% weight loss per hour isothermal, and moderate thermal stability at approximately 350° C., having approximately 2–3% weight loss per hour isothermal. However, the polynorbornene material exhibits a marked decrease in thermal stability above about 405° C. Accordingly, post-deposition processing temperatures for this material are preferably kept below about 405° C., more preferably kept below about 350° C. and even more preferably kept below about 300° C.

Figure 1B:
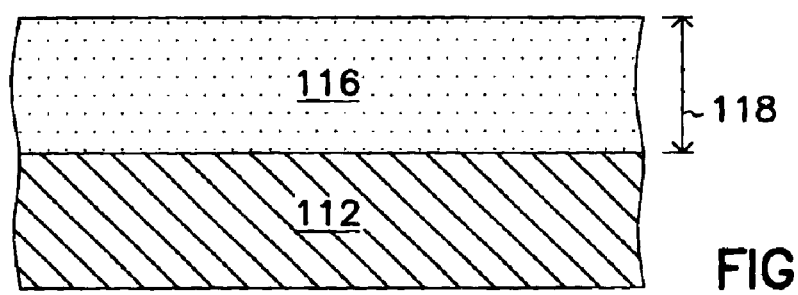
Figure 1C:
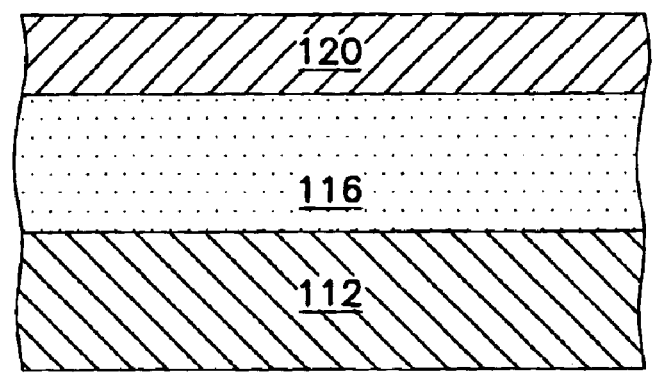

FIGS. 1A to 1C illustrate general process steps utilized to form a foamed polynorbornene material on a wafer or substrate. First, the substrate can optionally be placed in a low temperature furnace for a dehydration bake (e.g., about 30 minutes at about 150° C.) in order to remove residual moisture on the surface of the substrate. In one embodiment of the invention, the substrate will include a metallization layer, such as aluminum, copper, silver, gold or tungsten, as well as alloys containing such metals.

In order to form a foamed polynorbornene insulation layer in an integrated circuit, a polynorbornene material 110 is applied to the wafer or substrate 112, as illustrated in FIG. 1A. An associated primer may be used to aid curing of the polynorbornene polymeric material. Additives or modifiers may be incorporated in the polynorbornene material to alter physical properties or curing characteristics of the polynorbornene material.

A wide variety of methods are available for applying the polynorbornene material 110 to the substrate 112. For example, spin-on coating, spraying, and dipping may be utilized to apply a polynorbornene material to the substrate 112. Furthermore, a combination of such application techniques or any other techniques known to one skilled in the art may be used. The thickness of the layer of polynorbornene material 110, as indicated by arrow 114, is adjusted according to the desired thickness of the resulting foamed polynorbornene material, taking into account the foam expansion rate of the foaming process utilized. For example, the thickness of the layer of polynorbornene material may be in the range of about 0.1 microns to about 1.0 microns. The thickness of the resulting foamed polynorbornene material should be such that it provides adequate electrical insulation without preventing a decrease in the minimum achievable feature size of the integrated circuit. For many applications, a foamed polynorbornene material thickness of about 0.7 micron to about 2.1 microns is sufficient to provide adequate electrical insulation. Foamed polynorbornene thicknesses above 2.1 microns may be desirable where metal thicknesses above 2.0 microns are used. Such foamed polynorbornene thicknesses may range from about 0.2 microns up to about 10.0 microns or even more. Depending on the application, however, the thickness of the polynorbornene material 10 is adjusted according to these criteria and known methods for controlling the thickness of applied polynorbornene material 110 using those techniques. For example, when utilizing spin-on coating, the thickness can be varied by adjusting the rotational speed and/or the acceleration of the spinner.

After the polynorbornene material 110 is applied to the substrate 112, an optional low temperature bake can be performed to drive off most of the solvents which may be present in the polynorbornene material 110. Next, the polynorbornene material 110 is cured, if needed. Curing will refer to developing a large number of cross-links between polymer chains. Techniques for curing polymers are well known to one skilled in the art and any number of curing methods may be suitable for the processing described herein. For example, curing of polymers can include baking the polymers in a furnace (e.g., about a 350° C. to about a 500° C. furnace) or heating them on a hot plate. Curing may occur in response to exposure to visible or ultraviolet light. Curing may further include adding curing (e.g., cross-linking) agents to the polymer. For one embodiment, it is preferred to use a multiple step cure to increase effectiveness. For example, such a multiple step cure may include processing in the range of about 1001° C. to about 125° C. for about 10 minutes, about 250° C. for about 10 minutes, and followed by about 375° C. for about 20 minutes. It should be readily apparent to one skilled in the art that the times and temperatures may vary depending upon various factors, including the desired properties of the materials used, and that the present invention is in no manner limited to the illustrative multiple step cure presented above. Various multiple step curing methods may be suitable. For one embodiment, hot plate curing is used.

A supercritical fluid is then utilized to convert at least a portion of the polynorbornene material 110, as illustrated in FIG. 1A, into a foamed polynorbornene material 116 having a thickness 118, as illustrated in FIG. 1B. A gas is determined to be in a supercritical state (and is referred to as a supercritical fluid) when it is subjected to a combination of pressure and temperature above its critical point. The critical point is the temperature (critical temperature) and pressure (critical pressure) at which the liquid and gas phases of the fluid become a single phase (i.e., the liquid and gas phases coexist). A wide variety of compounds and elements can be converted to the supercritical state in order to be used to form the foamed polynorbornene material 116.

Preferably, the supercritical fluid is selected from the group of ammonia ($NH_3$), an amine ($NR_3$), an alcohol (ROH), water ($H_2O$), carbon dioxide ($CO_2$), nitrous oxide ($N_2O$), a noble gas (e.g., He, Ne, Ar), a hydrogen halide (e.g., hydrofluoric acid (HF), hydrochloric acid (HCl), hydrobromic acid (HBr)), boron trichloride ($BCl_3$), chlorine ($Cl_2$), fluorine ($F_2$), oxygen ($O_2$), nitrogen ($N_2$), a hydrocarbon (e.g., dimethyl carbonate ($CO(OCH_3)_2$), methane ($CH_4$), ethane ($C_2H_6$), propane ($C_3H_8$), ethylene ($CH_4$), etc.), a fluorocarbon (e.g., $CF_4$, $C_2F_4$, $CH_3F$, etc.), hexafluoroacetylacetone ($C_5H_2F_6O_2$), and combinations thereof. Although these and other fluids may be used, it is preferable to have a fluid with a low critical pressure, preferably below about 100 atmospheres, and a low critical temperature of at or near room temperature. Further, it is preferred that the fluids be nontoxic and nonflammable. Likewise, the fluids should not degrade the properties of the polynorbornene material used. Most preferably, however, the supercritical fluid is $CO_2$, due to the relatively inert nature of $CO_2$, with respect to most polymeric materials. Furthermore, the critical temperature (about 31° C.) and critical pressure (about 7.38 MPa, 72.8 atm) of $CO_2$ are relatively low. Thus, when $CO_2$ is subjected to a combination of pressure and temperature above about 7.38 MPa (72.8 atm) and about 31° C., respectively, it is in the supercritical state.

The structure illustrated in FIG. 1A is exposed to the supercritical fluid for a sufficient time period to foam at least a portion of the polynorbornene material 110 to the desired resulting thickness 118, as illustrated in FIG. 1B. Generally, the substrate 112 is placed in a processing chamber and the temperature and pressure of the processing chamber are elevated above the temperature and pressure needed for creating and maintaining the particular supercritical fluid. After the polynorbornene material 110 is exposed to the supercritical fluid for a sufficient period of time to saturate the polynorbornene material 110 with supercritical fluid, the flow of supercritical fluid is stopped and the processing chamber is depressurized. Upon depressurization, the foaming of the polynorbornene material occurs as the supercritical state of the fluid is no longer maintained.

The foaming of the polynorbornene material 110 may be assisted by subjecting the material to thermal treatment, e.g., a temperature suitable for assisting the foaming process but below temperatures which may degrade the material. Further, the depressurization to ambient pressure is carried out at any suitable speed, but the depressurization must at least provide for conversion of the polynorbornene material 110 before substantial diffusion of the supercritical fluid out of the polynorbornene material 110 occurs. Foaming of the polynorbornene material 110 may occur over a short period of time. The period of time that it takes for the saturated polynorbornene material 110 to be completely foamed depends on the type and thickness of the polynorbornene material and the temperature/pressure difference between the processing chamber and ambient environment. The specific time, temperature and pressure combination used depends on the diffusion rate of the gas through the polymer and the thickness of the layer of polymer used. It should be readily apparent that other foaming techniques may be used in place of or in combination with that described herein in accordance with the present invention.

The foamed polynorbornene material 116, as illustrated in FIG. 1B, is readily characterized by the number and size of cells distributed therein. Cell, as used herein, refers to an enclosed region of air (or other ambient gas). The size of a cell is determined by the nominal diameter of the enclosed region of air. For one embodiment, the size of cells is no greater than about 3.0 microns. For another embodiment, the size of cells is less than about 1.0 micron. In some applications, the size of cells according to the present invention is below 0.1 micron. It is desirable to have small cell sizes so that the foamed polynorbornene material 116 can be utilized in extremely small spaces. For example, as device density increases along with minimization in feature sizes, the space between metal lines in the metallization level is becoming increasingly small. This is the reason that capacitive coupling occurs between such metal lines. In order to meet the demand for high density integrated circuits with minimal feature sizes, it is necessary that foamed polynorbornene material 116 be able to be formed in such small dimensions. As long as the maximum cell size of the foamed polynorbornene material 116 is smaller than the minimum distance between metal lines, foamed polynorbornene material 116 provides adequate electrical insulation without a potentially detrimental reduction in mechanical integrity.

Figure 1D:
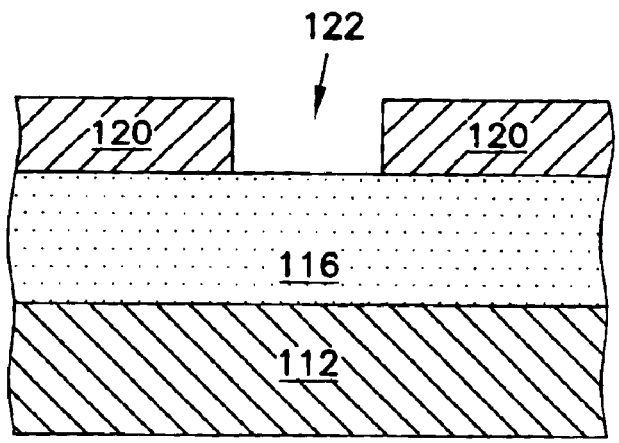
Figure 1E:
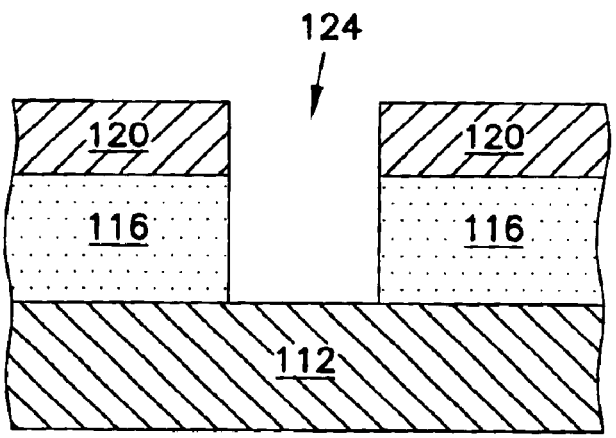
Figure 1F:
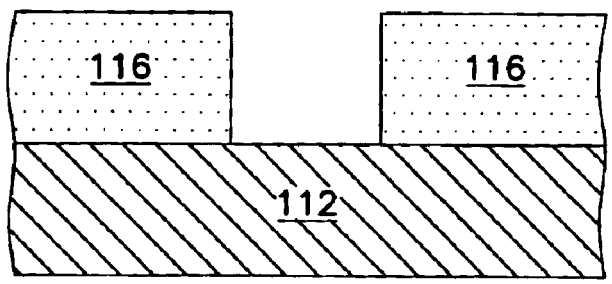

The foamed polynorbornene material 116 can be patterned by conventional photolithography and etching processes, if desired. Such optional processing steps are illustrated in FIGS. 1C–1F. First, as illustrated in FIG. 1C, a resist layer 120 (e.g., photoresist) is coated on the foamed polynorbornene material 116, as is well known to one skilled in the art. Next, the resist layer 120 is patterned. For one embodiment, patterning is facilitated by exposing and developing a photoresist layer (e.g., utilizing standard photolithography techniques), resulting in a patterned layer including resist 120 and throughholes 122 to the underlying foamed polynorbornene material 116, as illustrated in FIG. 1D. The exposed foamed polynorbornene material 116 is then removed. For one embodiment, removal is facilitated by etching using suitable etch chemistries for the type of polynorbornene material used. For example, most organic polymers can be etched using an oxygen plasma. The patterned structure is illustrated in FIG. 1E, wherein a contact hole or throughhole 124 extends through the foamed polynorbornene material 116 to the underlying substrate 112. Then, as illustrated in FIG. 1F, the resist layer 120, illustrated in FIG. 1E, is removed by use of standard photoresist removal methods, such as wet resist stripping agents. Subsequent processing steps, if any, are then performed as is well known to one skilled in the art of semiconductor processing.

A more specific use of the present invention is illustrated by way of FIGS. 2A–2E. FIGS. 2A–2E illustrate the use of a dual damascene metallization process with foamed polynorbornene material as the insulating interlayer dielectric material. The dual damascene process is generally well known in the art. However, for additional information, U.S. Pat. No. 4,962,058 issued to Cronin et al. discusses the dual damascene process in more detail than what will be provided herein. The specific use illustrated in FIGS. 2A–2E is the dual damascene metallization of a transistor. The application of the foamed polymeric material of the present invention, however, is not meant to be limited to the dual damascene metallization of transistor devices. Many devices, such as memory cells and capacitors, can be metallized using such a dual damascene process with a foamed polynorbornene material as the interlayer dielectric.

Figure 2A:
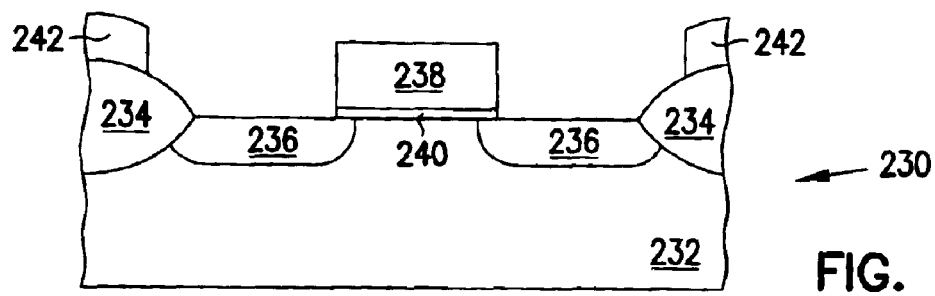
FIGS. 2A–2C are cross-sectional views of a portion of a semiconductor structure at various processing stages in accordance with another embodiment of the invention.

As illustrated in FIG. 2A, a substrate 230 is conventionally processed up to the point where the first level of interconnection metal is to be formed and will not be described in detail herein. The first level of interconnection metal is typically termed the contact because it connects the first metal line to an active area on an underlying device. In FIG. 2A, the device is a transistor. The transistor is laterally isolated on a doped silicon wafer 232 by field oxide 234. Implanted source/drain regions 236 are formed in the doped silicon wafer 232 on either side of a gate 238 and gate oxide 240 stack. Patterned polysilicon 242 typically remains on the field oxide 234 from the gate 238 patterning step, such as adjacent word lines in a memory device.

Figure 2B:
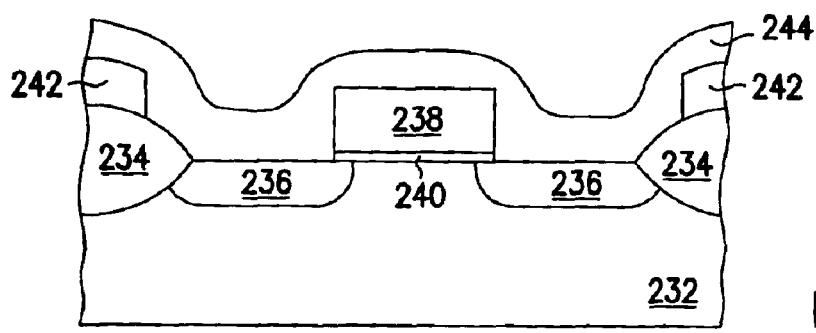
Figure 2C:
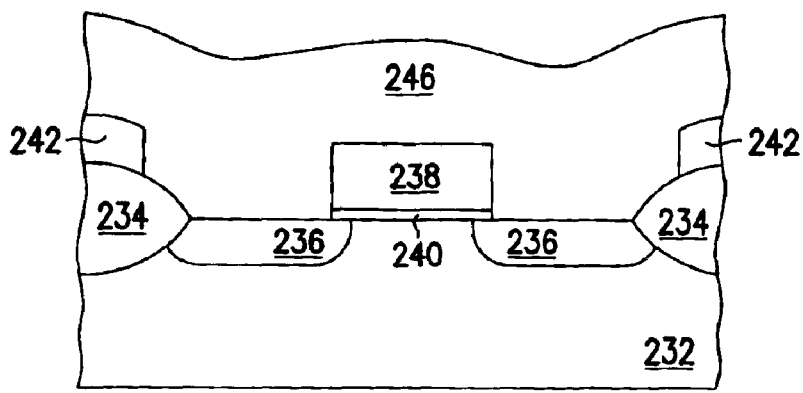

As illustrated in FIG. 2B, a layer of polynorbornene material 244 is then applied to the substrate 230. At least a portion of the polynorbornene material 244 illustrated in FIG. 2B is then converted to a foamed polynorbornene material 246 as illustrated in FIG. 2C. The technique for converting the polynorbornene material 244 to a foamed polynorbornene material 246 was described previously with respect to FIGS. 1A–1B. At this point, the foamed polynorbornene material 246 may be planarized using known planarization methods, such as using etch back techniques or more preferably chemical mechanical planarization techniques.

Figure 2D:
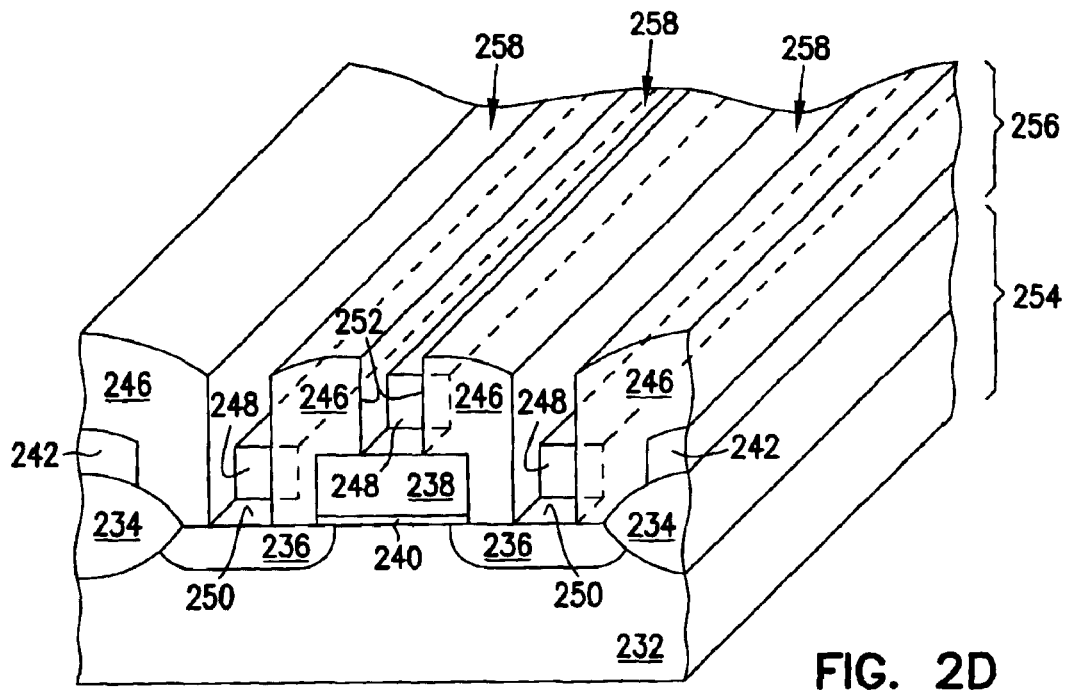
FIG. 2D is a perspective view of the portion of a semiconductor structure of FIG. 2C at a subsequent processing stage.

As illustrated in FIG. 2D, contact holes 248 are defined to active areas 236 and 238 of the transistor. Optionally, barrier materials, such as titanium nitride or titanium silicide, can be formed on the bottom 250 and/or sidewalls 252 of the contact holes 248. Techniques for forming such materials are well known to one of ordinary skill in the art. For simplicity, such barrier materials are not illustrated in FIG. 2D. At this point it is convenient to point out the device level 254 of the substrate underlying the metallization level 256 of the substrate. In the metallization level 256 of the substrate, trenches 258 are defined in the foamed polynorbornene material 246. Trenches 258 extend over the contact holes 248 and define the position and width of metal lines that are subsequently formed therein.

To form the contact holes 248 and trenches 258, the structure illustrated in FIG. 2C is patterned, such as by using conventional photolithography and etching. Such steps are described previously with respect to FIGS. 1C–1F. Due to the nature of the dual damascene process, the depth of the etch is variable across the surface of the substrate, e.g., the etch depth is greater where contact holes 248 are defined and less where only trenches 258 are defined between devices. Thus, two mask and etch steps can be utilized in a conventional photolithographic process to define the contact holes 248 separately from the trenches 258. Alternatively, a gray mask pattern can be utilized to define the contact holes 248 and trenches 258 simultaneously in one photolithographic mask and etch step.

Figure 2E:
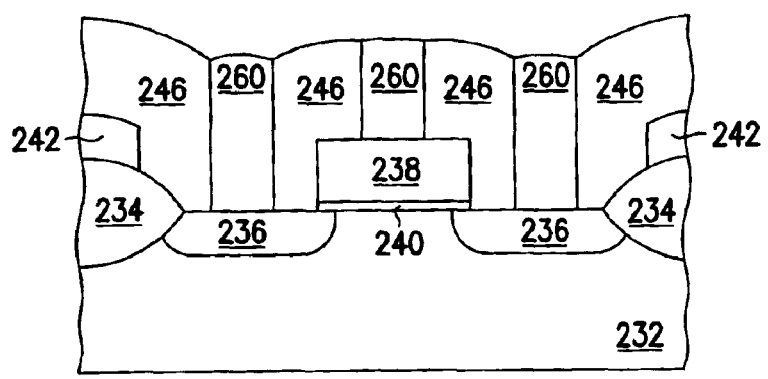
FIG. 2E is a cross-sectional view of the portion of a semiconductor structure of FIG. 2D at a subsequent processing stage.

Next, as illustrated in FIG. 2E, metal 260 is deposited and etched back in the contact holes 249 and trenches 258. Typically, the metal 260 is aluminum (Al) or an aluminum alloy. Preferable aluminum alloys include Al/Cu and Al/Cu/Si alloys. For further embodiments, the metal 260 may be aluminum, copper, silver, gold or tungsten, as well as alloys containing such metals. A wide variety of suitable methods are available for depositing the metal 260. Most techniques are physical techniques (e.g., sputtering and evaporating). The advantage of a dual damascene process is that only one metal 260 deposition step is needed to fill both the contact holes 248 and trenches 258. Excess metal 260 deposited outside of the defined contact holes 248 and trenches 258 is etched back using any suitable method. For example, planarization (e.g., using chemical-mechanical planarization) is one useful method. The sequence of steps illustrated in FIGS. 2B–2E is then repeated, if necessary, depending on the number of conductive layers in the metallization level of the substrate.

Figure 3:
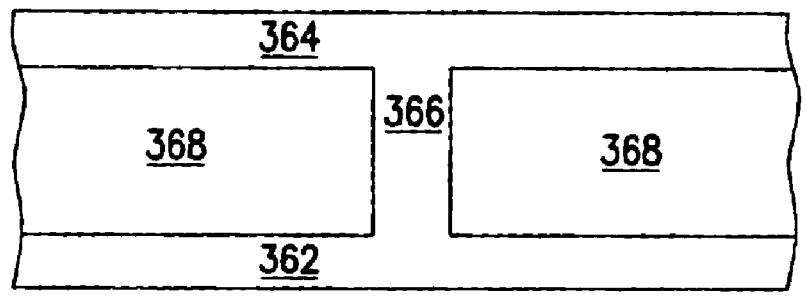
FIG. 3 is a cross-sectional view of a portion of a semiconductor structure in accordance with an embodiment of the invention.

FIG. 3 illustrates, in general, one embodiment of part of a metallization level of an integrated circuit. A first conductive layer 362 (e.g., metal line) is electrically connected to a second conductive layer 364 (e.g., metal line) with a conductive via 366. Foamed polynorbornene material 368 in accordance with the present invention electrically insulates the first and second conductive layers 362 and 364. The process utilized to form the structure illustrated in FIG. 3 is readily apparent given the preceding examples. This structure can be formed utilizing dual damascene techniques or standard processing techniques. Details of these processes will not be further recited here.

Figure 4:
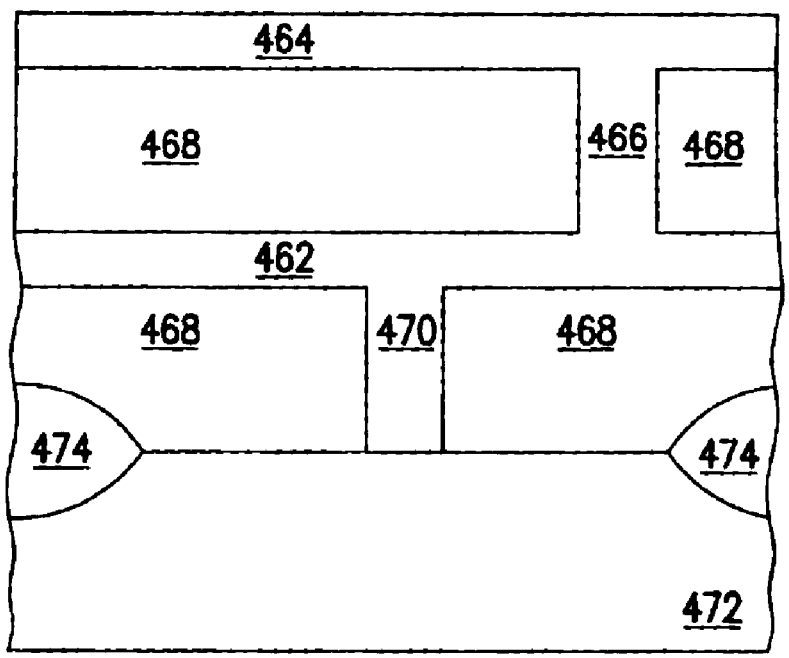
FIG. 4 is a cross-sectional view of a portion of a semiconductor structure in accordance with another embodiment of the invention.

FIG. 4 illustrates another embodiment of a metallization level of an integrated circuit. A first conductive layer 462 is electrically connected to a second conductive layer 464 with a conductive via 466. Note that the via 466 is not coincident with the contact 470 to the underlying device. Alternatively, the via 466 can be formed coincidentally with the contact 470 to the underlying device. Foamed polynorbornene material 468 in accordance with the present invention electrically insulates the first and second conductive layers 462 and 464. Foamed polynorbornene material 468 also electrically insulates the first conductive layer 462 from an active area, represented generally as 472, of an underlying substrate. Device level insulation 474 can be silicon dioxide or foamed insulating material of the present invention if processing temperatures permit. This structure can be formed utilizing dual damascene techniques or standard processing techniques. Details of these processes will not be further recited here.

Memory Devices

Conductive layers as described above, with interposing foamed polynorbornene insulation, may advantageously be used in the fabrication of memory devices as one form of integrated circuit device. Examples of such uses of conductive layers include word lines for control of access transistors of memory cells, as well as digit lines for the coupling of the memory cell Input/Output circuitry. Such conductive layers may further be used for coupling the various elements of a memory device.

Figure 5:
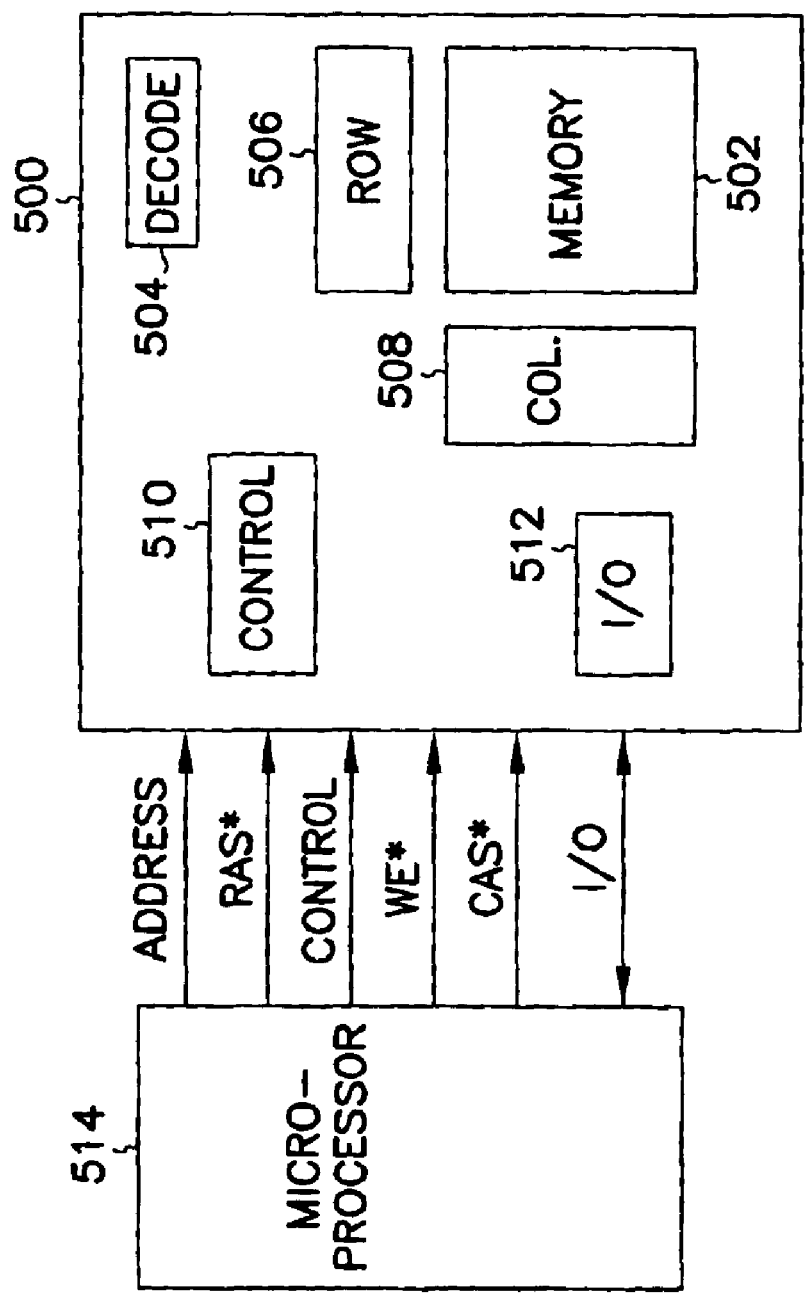
FIG. 5 is a block diagram of an integrated circuit memory device in accordance with an embodiment of the invention.

FIG. 5 is a simplified block diagram of a memory device according to one embodiment of the invention. The memory device 500 includes an array of memory cells 502, address decoder 504, row access circuitry 506, column access circuitry 508, control circuitry 510, and Input/Output circuit 512. The memory can be coupled to an external microprocessor 514, or memory controller for memory accessing. The memory receives control signals from the processor 514, such as WE*, RAS* and CAS* signals. The memory is used to store data which is accessed via I/O lines. It will be appreciated by those skilled in the art that additional circuitry and control signals can be provided, and that the memory device 500 of FIG. 5 has been simplified to help focus on the invention. Memory device 500 includes two or more conductive layers coupled to one or more of the array of memory cells 502, the address decoder 504, the row access circuitry 506, the column access circuitry 508, the control circuitry 510 and the Input/Output circuit 512. A first conductive layer of the two or more conductive layers is electrically insulated from a second conductive layer of the two or more conductive layers by a foamed polynorbornene material.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 6:
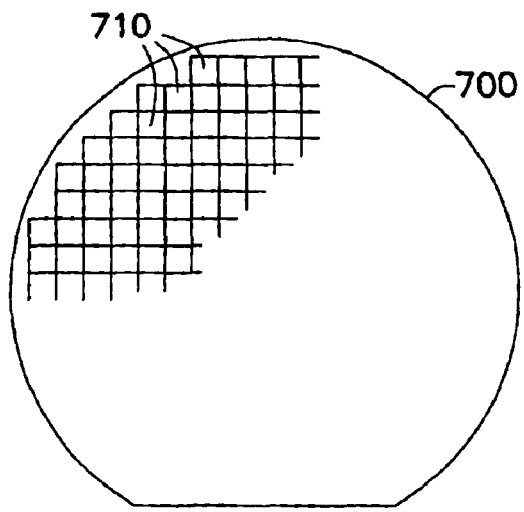
FIG. 6 is an elevation view of a wafer containing semiconductor dies in accordance with an embodiment of the invention.

With reference to FIG. 6, in one embodiment, a semiconductor die 710 is produced from a wafer 700. A die is an individual pattern, typically rectangular, on a substrate that contains circuitry, or integrated circuit devices, to perform a specific function. The die 710 contains two or more conductive layers coupled to the integrated circuit devices. A first conductive layer of the two or more conductive layers is electrically insulated from a second conductive layer of the two or more conductive layers by a foamed polynorbornene material.

A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 7:
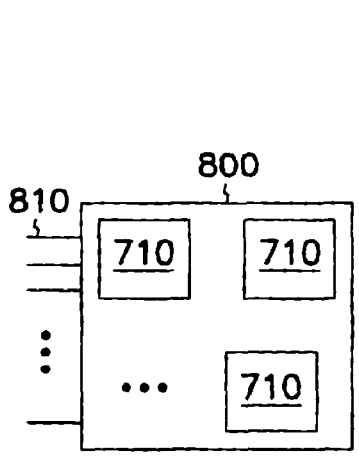
FIG. 7 is a block diagram of an exemplary circuit module in accordance with an embodiment of the invention.

As shown in FIG. 7, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contains at least two conductive layers electrically insulated by a foamed polynorbornene material in accordance with the invention.

Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 8:
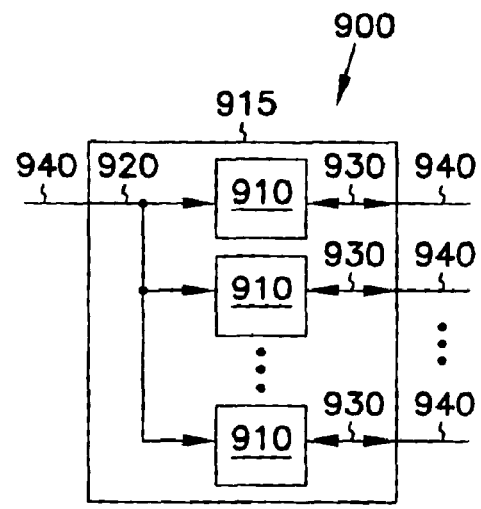
FIG. 8 is a block diagram of an exemplary memory module in accordance with an embodiment of the invention.

FIG. 8 shows one embodiment of a circuit module as memory module 900. Memory module 900 contains multiple memory devices 910 contained on support 915, the number depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 8.

Electronic Systems

Figure 9:
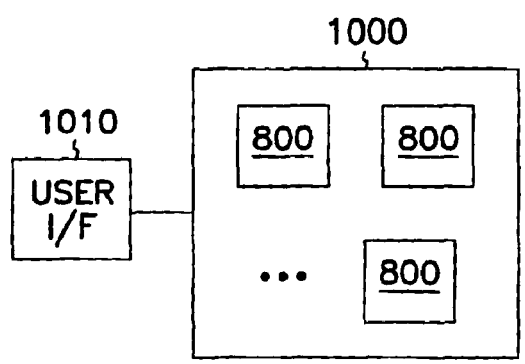
FIG. 9 is a block diagram of an exemplary electronic system in accordance with an embodiment of the invention.

FIG. 9 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 10:
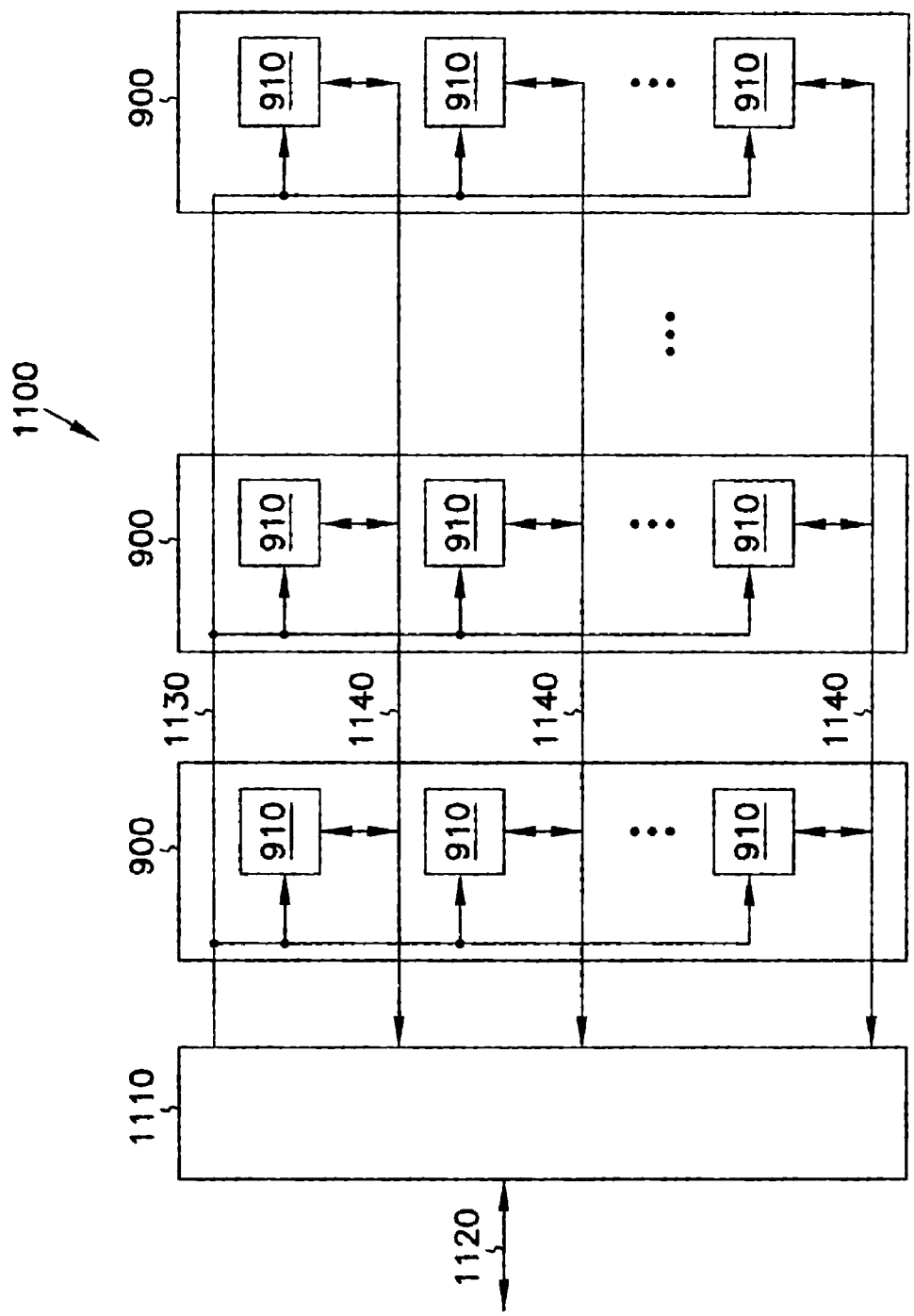
FIG. 10 is a block diagram of an exemplary memory system in accordance with an embodiment of the invention.

FIG. 10 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 11:
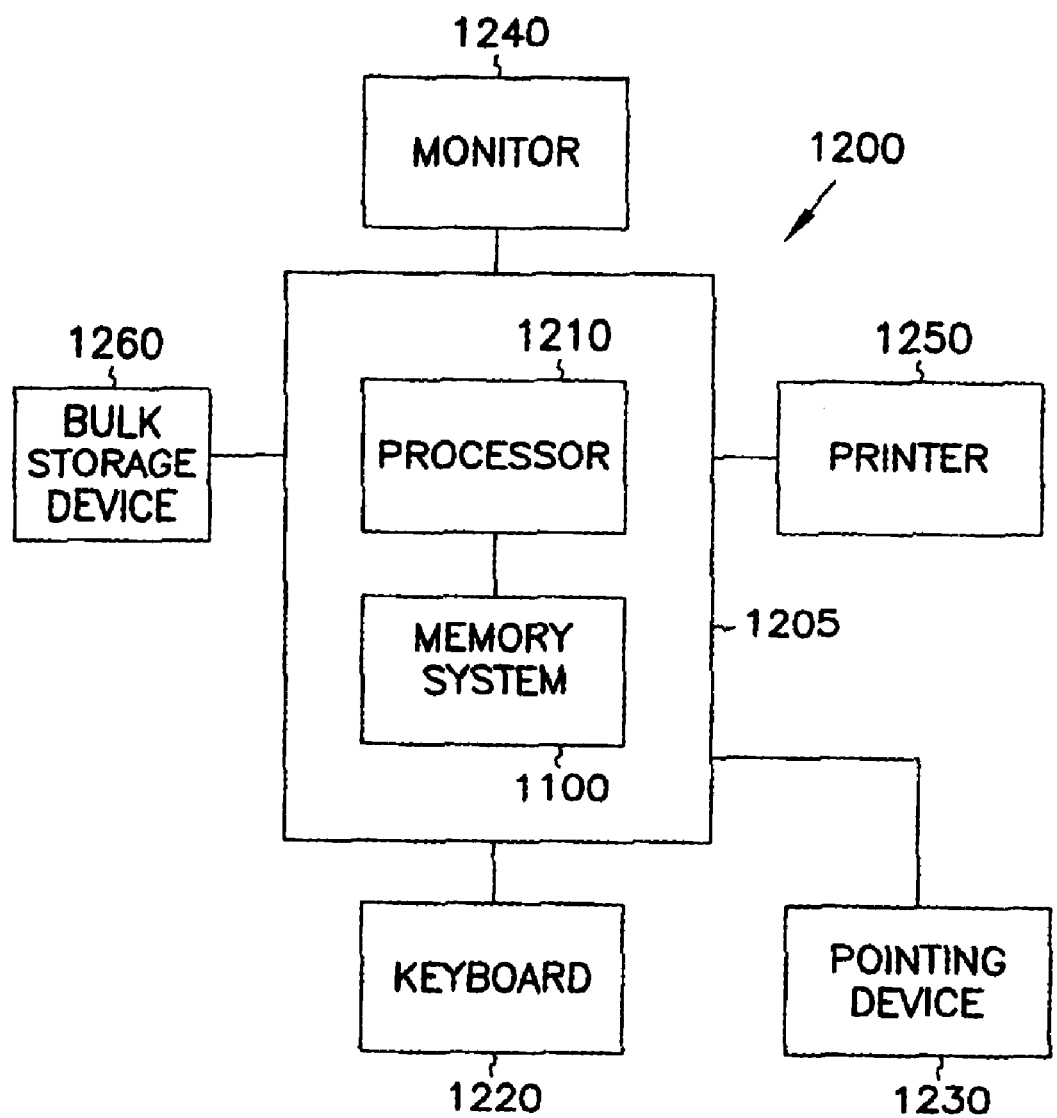
FIG. 11 is a block diagram of an exemplary computer system in accordance with an embodiment of the invention.

FIG. 11 shows a further embodiment of an electronic system as a computer 11 system 1200. Computer system 1200 contains a processor 1210 and a memory system 11100 housed in a computer unit 1205. Computer system 1200 is but one example of an electronic system, i.e., memory system 1100, as a subcomponent. Computer system 1200 optionally contains user interface components. Depicted in FIG. 11 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

CONCLUSION

Methods of providing foamed polynorbornene insulating material for use with an integrated circuit device have been disclosed, as well as apparatus and systems making use of such foamed polynorbornene insulating materials. The methods include forming a layer of polynorbornene material and converting at least a portion of the layer of polynorbornene material to a foamed polynorbornene material, such as by exposing the layer of polynorbornene material to a supercritical fluid. The foamed polynorbornene material can provide electrical insulation between conductive layers of the integrated circuit device.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, the foamed polynorbornene material of the present invention can be utilized as an interlayer dielectric insulating material where the metal lines are formed by a variety of methods. This includes single damascene metallization and conventional (i.e., non-damascene) metallization techniques. Furthermore, the foamed polynorbornene material can be utilized anywhere an electrical insulation material is needed, so long as the polynorbornene material is stable at the temperatures that it will subsequently be subjected to. A wide variety of other uses are also suitable for use of the present invention. For example, the present invention is also suitable for forming capacitors having a foamed polynorbornene material dielectric layer therein.

It is not necessary that all polynorbornene material within an integrated circuit be converted to foamed polynorbornene material in accordance with the present invention. It is only necessary to convert a portion of the polynorbornene material to the foamed polynorbornene material to obtain advantages of the various embodiments of the invention. Furthermore, foamed polynorbornene material of the various embodiments of the invention can be utilized in conjunction with other insulating material(s). For example, adjacent layers of foamed polynorbornene material and silicon dioxide insulating material can be utilized in regions of an integrated circuit where different electrical isolation is desired.

Accordingly, this application is intended to cover any adaptations or variations of the invention. It is manifestly intended that this invention be limited only by the following claims and equivalents thereof.

What is claimed is:

1. A method of forming an insulating material for use in an integrated circuit, the method comprising:
   forming a layer of polynorbornene material on a substrate of the integrated circuit; and
   converting at least a portion of the layer of polynorbornene material to a foamed polynorbornene material such that the foamed polynorbornene material contacts a gate of a transistor in the integrated circuit.

2. The method of claim 1, wherein converting at least a portion of the layer of polynorbornene material to a foamed polynorbornene material comprises exposing at least a portion of the polynorbornene material to a supercritical fluid.

3. The method of claim 2, wherein the supercritical fluid is carbon dioxide.

4. The method of claim 1, wherein converting at least a portion of the layer of polynorbornene material to a foamed polynorbornene material comprises saturating the polynorbornene material with a fluid at or above the critical point of the fluid in a process chamber, and subsequently depressurizing the process chamber.

5. The method of claim 1, wherein converting at least a portion of the layer of polynorbornene material to a foamed polynorbornene material comprises converting at least a portion of the layer of polynorbornene material to a foamed polynorbornene material having a maximum cell size of less than about 3.0 microns.

6. The method of claim 1, wherein converting at least a portion of the layer of polynorbornene material to a foamed polynorbornene material comprises converting at least a portion of the layer of polynorbornene material to a foamed polynorbornene material having a maximum cell size of less than about 1.0 micron.

7. The method of claim 3, wherein converting at least a portion of the layer of polynorbornene material to a foamed polynorbornene material comprises converting at least a portion of the layer of polynorbornene material to a foamed polynorbornene material having a maximum cell size of less than about 0.1 micron.

8. The method of claim 1, further comprising:
   removing a portion of the foamed polynorbornene material, thereby forming at least one opening in the foamed polynorbornene material; and
   forming a conductive layer in at least one opening in the foamed polynorbornene material.

9. The method of claim 8, wherein forming a conductive layer comprises forming a metal line.

10. The method of claim 9, wherein the metal line is formed of a metal selected from the group consisting of aluminum, copper, gold, silver, tungsten and alloys containing at least one of aluminum, copper, gold, silver and tungsten.

11. The method of claim 8, further comprising:
removing a portion of the conductive layer.

12. The method of claim 1 wherein removing a portion of the conductive layer comprises removing a portion of the conductive layer by chemical-mechanical planarization.

13. The method of claim 8, wherein removing a portion of the foamed polynorbornene material further comprises:
patterning the foamed polynorbornene material, thereby forming exposed portions of the foamed polynorbornene material; and
etching the exposed portions of the foamed polynorbornene material, thereby forming the at least one opening.

14. The method of claim 13, wherein etching comprises etching using an oxygen plasma.

15. The method of claim 1, wherein forming a layer of polynorbornene material comprises forming a layer of a polynorbornene material having approximately 0.1 to 0.2% weight loss per hour isothermal at approximately 300° C.

16. The method of claim 1, wherein the method is performed in the order presented.

17. A method of forming an insulating material for use in an integrated circuit, the method comprising:
forming a layer of polynorbornene material on a substrate of the integrated circuit, the polynorbornene material in contact with an active region of the integrated circuit;
saturating the layer of polynorbornene material with a fluid at or above the critical point of the fluid in a process chamber; and
depressurizing the process chamber, thereby converting at least a portion of the layer of polynorbornene material to a foamed polynorbornene material.

18. The method of claim 17, wherein the method is performed in the order presented.

19. A method of forming an insulating material for use in an integrated circuit, the method comprising:
forming a layer of polynorbornene material on a substrate of the integrated circuit the polynorbornene material in contact with an active region of the integrated circuit;
saturating the layer of polynorbornene material with carbon dioxide at or above the critical point of the carbon dioxide in a process chamber; and
depressurizing the process chamber, thereby converting at least a portion of the layer of polynorbornene material to a foamed polynorbornene material.

20. The method of claim 19, wherein converting at least a portion of the layer of polynorbornene material to a foamed polynorbornene material comprises converting at least a portion of the layer of polynorbornene material to a foamed polynorbornene material having a maximum cell size of less than about 3.0 microns.

21. The method of claim 19, wherein converting at least a portion of the layer of polynorbornene material to a foamed polynorbornene material comprises converting at least a portion of the layer of polynorbornene material to a foamed polynorbornene material having a maximum cell size of less than about 1.0 micron.

22. The method of claim 19, wherein converting at least a portion of the layer of polynorbornene material to a foamed polynorbornene material comprises converting at least a portion of the layer of polynorbornene material to a foamed polynorbornene material having a maximum cell size of less than about 0.1 micron.

23. A method of forming a portion of an integrated circuit device, the method comprising:
forming a layer of polynorbornene material on a substrate of an integrated circuit, the polynorbornene material in contact with an active region of the integrated circuit;
saturating the layer of polynorbornene material with a fluid at or above the critical point of the fluid in a process chamber;
depressurizing the process chamber, thereby converting at least a portion of the layer of polynorbornene material to a foamed polynorbornene material;
removing a portion of the foamed polynorbornene material, thereby forming at least one opening in the foamed polynorbornene material; and
forming a conductive layer in at least one opening in the foamed polynorbornene material.

24. The method of claim 23, wherein the method is performed in the order presented.

25. A method of forming a portion of an integrated circuit device, the method comprising:
forming a layer of polynorbornene material on a substrate of an integrated circuit, the polynorbornene material in contact with an active region of the integrated circuit;
saturating the layer of polynorbornene material with a fluid at or above the critical point of the fluid in a process chamber;
depressurizing the process chamber, thereby converting at least a portion of the layer of polynorbornene material to a foamed polynorbornene material;
patterning the layer of foamed polynorbornene material, thereby forming exposed portions of the layer of foamed polynorbornene material;
etching the exposed portions of the layer of foamed polynorbornene material, thereby forming at least one opening in the foamed polynorbornene material; and
forming a conductive layer in at least one opening in the foamed polynorbornene material.

26. The method of claim 25, wherein the method is performed in the order presented.

27. A method of forming a portion of an integrated circuit device, the method comprising:
forming a layer of polynorbornene material on a substrate of an integrated circuit, the polynorbornene material in contact with an active region of the integrated circuit;
saturating the layer of polynorbornene material with a fluid at or above the critical point of the fluid in a process chamber;
depressurizing the process chamber, thereby converting at least a portion of the layer of polynorbornene material to a foamed polynorbornene material;
patterning the layer of foamed polynorbornene material, thereby forming exposed portions of the layer of foamed polynorbornene material;
etching the exposed portions of the layer of foamed polynorbornene material using an oxygen plasma, thereby forming at least one opening in the foamed polynorbornene material; and
forming a conductive layer in at least one opening in the foamed polynorbornene material.

28. The method of claim 27, wherein the method is performed in the order presented.

29. A method of forming a portion of an integrated circuit device, the method comprising:

forming an active area in a substrate of an integrated circuit;

forming a layer of polynorbornene material overlying and contacting the active area;

saturating the layer of polynorbornene material with a fluid at or above the critical point of the fluid in a process chamber;

depressurizing the process chamber, thereby converting at least a portion of the layer of polynorbornene material to a foamed polynorbornene material;

patterning the foamed polynorbornene material, thereby forming exposed portions of the foamed polynorbornene material;

etching the exposed portions of the foamed polynorbornene material, thereby forming a contact hole to the active area; and forming a conductive layer in the contact hole.

30. The method of claim 29, wherein the method is performed in the order presented.

31. A method of forming a portion of an integrated circuit device, the method comprising:

forming a first layer of polynorbornene material on and in contact with an active area of an integrated circuit device in a substrate of an integrated circuit;

converting at least a portion of the first layer of polynorbornene material to a first foamed polynorbornene material;

forming a first conductive layer to contact the active area of the integrated circuit device;

forming a second layer of polynorbornene material on the first conductive layer;

saturating the second layer of polynorbornene material with a fluid at or above the critical point of the fluid in a process chamber;

depressurizing the process chamber, thereby converting at least a portion of the second layer of polynorbornene material to a second foamed polynorbornene material;

removing a portion of the second foamed polynorbornene material, thereby forming at least one via to the first conductive layer; and forming a second conductive layer in the at least one via to couple to the first conductive layer.

32. The method of claim 31, wherein the method is performed in the order presented.

33. A method of forming a portion of an integrated circuit device, the method comprising:

forming a first layer of polynorbornene material on and in contact with an active area of an integrated circuit device in a substrate of an integrated circuit;

converting at least a portion of the first layer of polynorbornene material to a first foamed polynorbornene material;

forming a first conductive layer to contact the active area of the integrated circuit device;

forming a second layer of polynorbornene material on the first conductive layer;

saturating the second layer of polynorbornene material with a fluid at or above the critical point of the fluid in a process chamber;

depressurizing the process chamber, thereby converting at least a portion of the second layer of polynorbornene material to a second foamed polynorbornene material;

patterning the foamed polynorbornene material, thereby forming exposed portions of the second foamed polynorbornene material;

etching the exposed portions of the second foamed polynorbornene material, thereby forming at least one via to the first conductive layer; and forming a second conductive layer in the at least one via to couple to the first conductive layer.

34. The method of claim 33, wherein the method is performed in the order presented.

35. A method of forming an insulating material for use in an integrated circuit, the method comprising:

forming a layer of polynorbornene material on a substrate of the integrated circuit, the polynorbornene material in contact with an active region of the integrated circuit; and converting at least a portion of the layer of polynorbornene material to a foamed polynorbornene material by exposing at least a portion of the polynorbornene material to a supercritical fluid;

wherein the supercritical fluid comprises at least one fluid selected from the group consisting of ammonia, an amine, an alcohol, water, carbon dioxide, nitrous oxide, a noble gas, a hydrogen halide, boron trichloride, chlorine, fluorine, oxygen, nitrogen, a hydrocarbon, a fluorocarbon and hexafluoroacetylacetone.

36. A method comprising:

forming a layer of polynorbornene material on and in contact with an active area in a substrate of an integrated circuit; and converting at least a portion of the layer of polynorbornene material to a foamed polynorbornene material.

37. The method of claim 36, wherein converting at least a portion of the layer of polynorbornene material to a foamed polynorbornene material comprises exposing at least a portion of the polynorbornene material to a supercritical fluid.

38. The method of claim 37, wherein the supercritical fluid includes carbon dioxide.

39. The method of claim 36, wherein converting at least a portion of the layer of polynorbornene material to a foamed polynorbornene material comprises saturating the polynorbornene material with a fluid at or above the critical point of the fluid in a process chamber, and subsequently depressurizing the process chamber.

40. The method of claim 36, wherein converting at least a portion of the layer of polynorbornene material to a foamed polynorbornene material comprises converting at least a portion of the layer of polynorbornene material to a foamed polynorbornene material having a maximum cell size of less than about 3.0 microns.

41. The method of claim 36, wherein converting at least a portion of the layer of polynorbornene material to a foamed polynorbornene material comprises converting at least a portion of the layer of polynorbornene material to a foamed polynorbornene material having a maximum cell size of less than about 1.0 micron.

* * * * *

UNITED STATES PATENT AND TRADEMARK OFFICE
CERTIFICATE OF CORRECTION

PATENT NO. : 6,890,847 B2
DATED : May 10, 2005
INVENTOR(S) : Paul A. Farrar

It is certified that error appears in the above-identified patent and that said Letters Patent is hereby corrected as shown below:

Title page,
Item [56], References Cited, U.S. PATENT DOCUMENTS,
delete "437/677" and insert -- 437/67 --, therefor.
OTHER PUBLICATIONS,
"Bai, Yiqun et al.," reference, "Polynorbomene" and insert -- Polynorbornene --, therefor.

Column 3,
Lines 23-24, delete "polynorborene" and insert -- polynorbornene --,

Column 7,
Line 1, delete "10" and insert -- 110 --, therefor.
Line 24, delete "1001°" and insert -- 100° --, therefor.
Line 55, after "ethylene" delete "($CH_4$)" and insert -- ($C_2H_4$) --, therefor.

Column 13,
Line 21, after "computer" delete "11".
Line 22, delete "11100" and insert -- 1100 --, therefor.

Column 15,
Line 8, delete "claim 1" and insert -- claim 11, --.
Line 44, after "circuit" insert -- , --, therefor.

Signed and Sealed this

Twelfth Day of July, 2005

JON W. DUDAS
*Director of the United States Patent and Trademark Office*